United States Patent [19]

Briggs et al.

[11] Patent Number: 4,952,152
[45] Date of Patent: Aug. 28, 1990

[54] REAL TIME VEHICLE SIMULATION SYSTEM

[75] Inventors: John A. Briggs; Roderic C. Deyo, both of Salt Lake City, Utah; Edward J. Haug, Coralville, Iowa

[73] Assignee: Evans & Sutherland Computer Corp., Salt Lake City, Utah

[21] Appl. No.: 368,000

[22] Filed: Jun. 19, 1989

[51] Int. Cl.⁵ ............................................. G09B 9/00
[52] U.S. Cl. ..................................... 434/69; 434/62; 358/104; 364/578
[58] Field of Search ....................... 434/69, 38, 28, 62, 434/29, 30, 37, 11, 16, 26; 358/104; 364/578; 273/311, 312; 272/72, 73, DIG. 6

[56] References Cited

U.S. PATENT DOCUMENTS

| 4,077,138 | 3/1978 | Foerst | 434/69 |
| 4,487,584 | 12/1984 | Allen et al. | 358/104 X |
| 4,599,070 | 7/1986 | Hladky et al. | 434/45 |
| 4,735,410 | 4/1988 | Nobuta | 272/72 |
| 4,807,158 | 2/1989 | Blanton et al. | 434/43 X |

Primary Examiner—Richard J. Apley
Assistant Examiner—J. L. Doyle
Attorney, Agent, or Firm—Nilsson, Robbins, Dalgarn, Berliner, Carson & Wurst

[57] ABSTRACT

To accommodate computer graphics delays, the future position and orientation of a simulated vehicle are predicted in an operating sequence by separate coordinated models that are fed data signals indicating the operator's control actions. The control actions are extrapolated to provide further data signals. A suspension model and a nonlinear chassis model operate sequentially with a road model to provide one reference-state input to a prediction model. Other inputs to the prediction model are from the drive train and steering extrapolation units controlled by driver inputs.

11 Claims, 2 Drawing Sheets

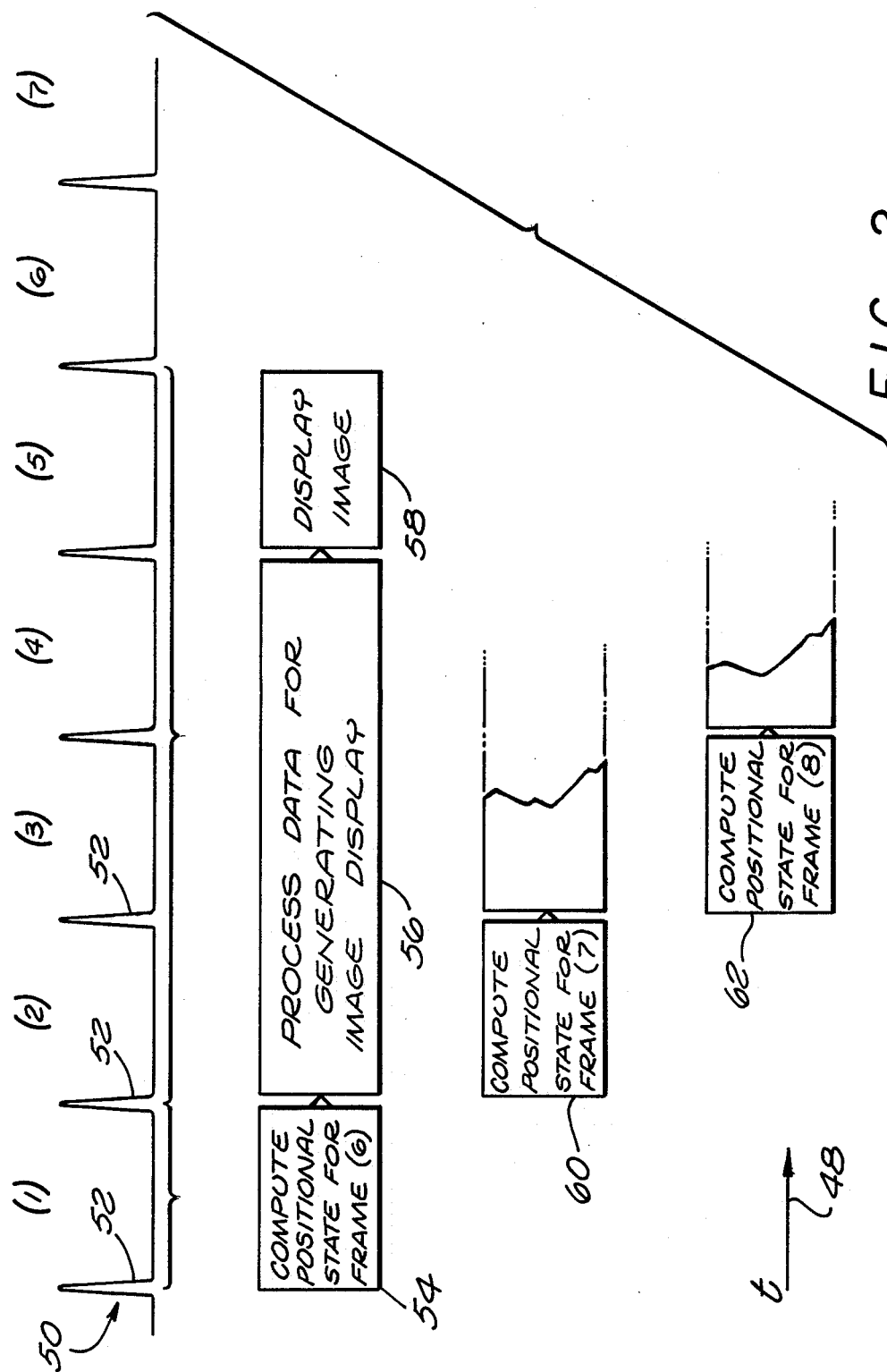

REAL TIME VEHICLE SIMULATION SYSTEM

BACKGROUND AND SUMMARY OF THE INVENTION

For a number of years, a need has been recognized for vehicle simulators that can be operated by a driver manipulating conventional controls to be shown the results of his action as by a simulated display. For example in training activities, simulators are widely used with respect to airplanes, helicopters and ground vehicles. In addition to training uses, vehicle simulators have been found useful in test and design work.

In the current state of technology, a visual display is considered a necessary component of a vehicle simulator. Accordingly, as the pilot or driver of a simulated vehicle manipulates the controls, he is provided with a responsive display showing the driver's view as the vehicle simulates movement in a programmed environment. Contemporary simulators utilize computer graphics techniques to provide a dynamic display. An environment is programmed and positional signals are developed to indicate the position and orientation of the vehicle in the environment. Representative simulator data is then supplied to a computer graphics system to attain a dynamic display.

Typically, the operation of the computer graphics system to provide image display signals from simulator data involves a relatively large time delay that often presents a problem. Consider an example. A high performance automobile may respond to the controls with a delay of only thirty milliseconds (30 ms). Simulator models for such an automobile are capable of approaching such response times in providing simulator electrical signals to indicate the position and orientation of the car. However, the utilization of such simulator signals by a computer graphics system (image generator) to provide signals for a visual display is likely to take much longer, e.g. sixty milliseconds (60 ms). Thus, accepting the inherent delay of the qraphics system introduces a response delay that is intolerable for many simulator applications.

Techniques have been used in previous vehicle simulators to compensate for the delay of the graphics system or image generator. Generally, the compensation has involved extrapolating from the current motion of the vehicle to predict future positional data for the display. Specifically, polynomial extrapolation, as well as feedback techniques and moving average techniques have been proposed for compensating time delays in prior systems. However, such arrangements tend to be inaccurate and typically impose the limitation that linear dynamics models be employed in the system. Because vehicle dynamics are not linear, in some instances a severe constraint is imposed on model fidelity if operation is restricted to motion extrapolation or linear prediction. Accordingly, a need exists for an improved vehicle simulation system that is relatively economical, enables the use of non-linearity in models and enables realistic time approximation of the motion characteristics of an actual vehicle.

In general, the system of the present invention incorporates simultaneous separate, but coordinated, dynamics models, each performing a specialized function in real time. In accordance with the invention, nonlinearity can be built into the models as needed. At least one simulation model simulates the complete vehicle movement to provide reference positional signals indicative of current position and orientation. As disclosed, the prediction model in the system utilizes the positional reference signals from the simulation model along with extrapolation representations (solely from control actions) to predict the positional state of the vehicle at a time approximating the time of display. In the disclosed embodiment, model fidelity is insured by periodically updating predictions with initial reference conditions provided from a full chassis simulation model. Also, in the disclosed embodiment, the simulation model involves two separate units, one in the form of a nonlinear suspension unit with relatively large bandwidth for full road and handling inputs. The other unit is the nonlinear full vehicle dynamics model with some or all of the nonlinear effects simulated.

BRIEF DESCRIPTION OF THE DRAWINGS

FIG. 2 is timing diagram illustrating the operation of the system of FIG. 1.

DESCRIPTION OF THE ILLUSTRATIVE EMBODIMENT

Figure 1:
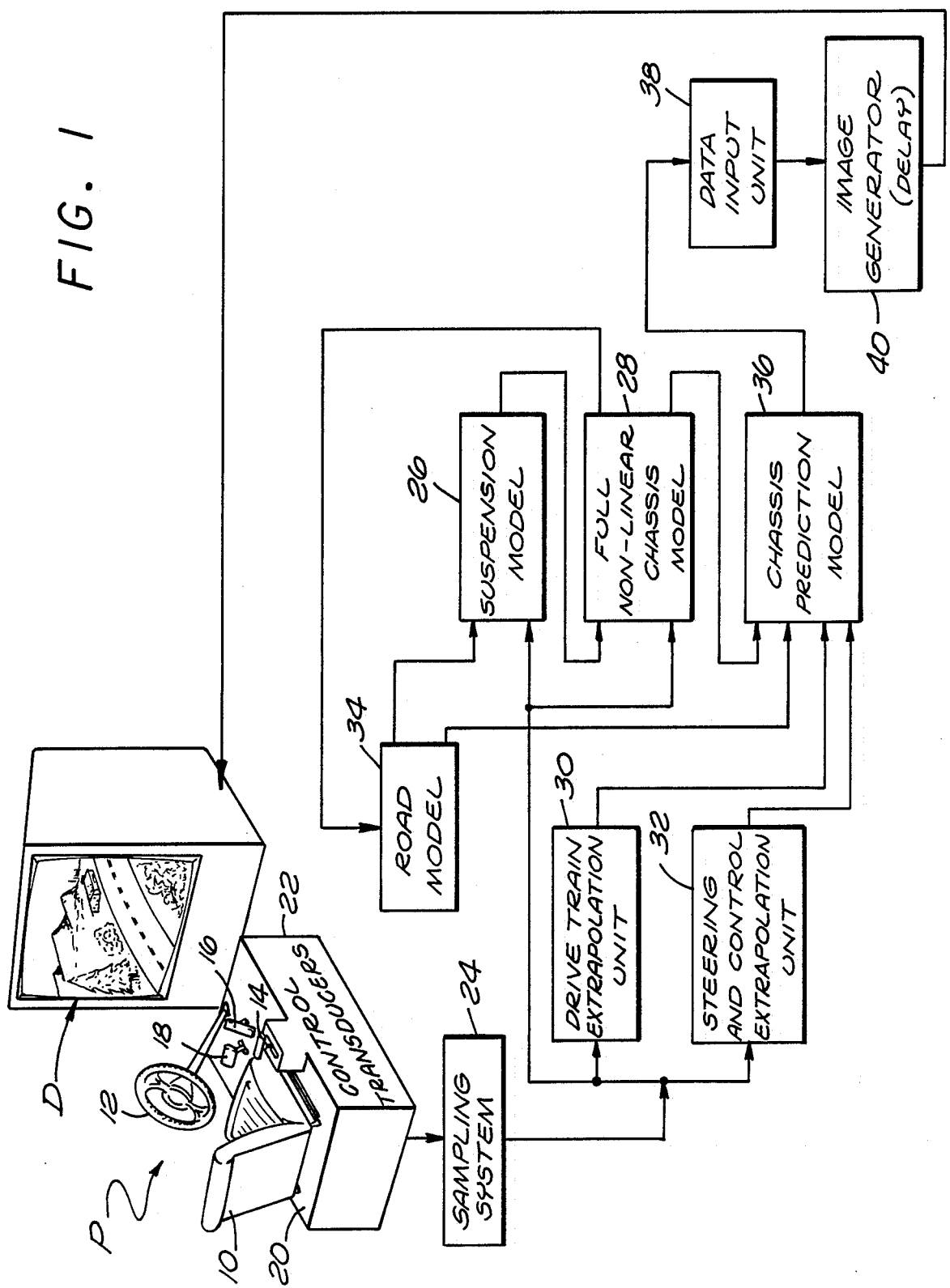
FIG. 1 is a block and pictorial diagram of a system constructed in accordance with the present invention.

As indicated above, a detailed illustrative embodiment of the present invention is disclosed herein. However, models, extrapolation techniques, image generators, display units, and other elements in accordance with the present invention may be embodied in a wide variety of different forms, some of which may be quite different from those of the disclosed embodiment. Consequently, the specific structural and functional details disclosed herein are merely representative; yet in that regard, they are deemed to afford the best embodiment for purposes of disclosure and to provide a basis for the claims herein which define the scope of the present invention.

Referring initially to FIG. 1, a driver position P (upper left) is generally represented to embody the conventional controls of an automobile. In accordance with the operation of the system of FIG. 1, a driver at the position P operates the controls, as though driving a car. As a result, the driver is presented a real time display D reflecting his actions in a programmed environment. With the present development, the response of the display D to control actions by the driver is realistic and timely. In accordance with well known techniques, other effects as motion also may be simulated for the driver Considering the system in somewhat greater detail, the driver position P incorporates a seat 10 facing typical automobile controls specifically illustrated in the form of a steering wheel 12, a shift lever 14, an accelerator pedal 16 and a brake pedal 18. The controls are illustrated to be mounted on a platform 20 which is incorporated with a housing or block 22 representing control transducers. The control transducers 22 may take the form of various well known instrumentation devices to provide analog signals continuously indicating the position of each of the controls.

The continuous analog signals from the control transducers 22 are periodically sampled by a sampling system 24 which also converts representative signal values to a digital format in accordance with well known techniques. Thus, periodic digital control signals are provided to indicate the driver's control actions at the position P. Categorically, the digital control signals from the sampling system 24 either involve steering maneuvers or drive train operations.

The control signals from the sampling system 24 are supplied to several blocks in the total system of FIG. 1 representing extrapolation units and models. The extrapolation units and models are connected with a road model 34 and a chassis prediction model 36 as described in detail below. Generally, the models 26, 28, 34 and 36 are responsive devices to represent conditions that result from input signals indicating dynamic operation. Various forms of such devices are well known in the science of simulation.

Specifically, the digitized control signals from the sampling system 24 are supplied to: the suspension model 26, the full nonlinear chassis model 28 and the extrapolation units 30 and 32.

The suspension model 26 is a high frequency apparatus utilizing computer techniques as well known in the art and implements a set of nonlinear recursive suspension and time equations to accurately model a wide spectrum of suspension motion.

The model 26 is coupled to the road model 34; and in that regard, a full road geometry is used to input tire forces.

The model 26 runs faster than the full nonlinear model 28, and accordingly, allows for shorter integration time steps. Such operation improves the model bandwidth and integration stability and accuracy. In that regard, higher frequency motion (above 10 Hertz) can be modeled.

The output from the suspension model 26 is in the form of positional and velocity data and is supplied to the full nonlinear chassis model 28 which makes use of the full recursive vehicle dynamics algorithms and calculates highly accurate positional information on the chassis (position and orientation). The model 28 makes use of drive train forces and incorporates high frequency suspension motions calculated in the suspension model 26. Accordingly, as explained in greater detail below, the full chassis model 28 provides accurate initial conditions to the nonlinear chassis prediction model 36 for the computation of data for each frame of a dynamic picture shown by the display D. The chassis prediction model 36 is a relatively simple yet accurate device, used to perform chassis motion integration advanced by several frame cycles. The model 36 processes extrapolation information from the drive train extrapolation unit 30 and the steering and control extrapolation unit 32. Accordingly, the prediction model 36 receives: initial condition data (from model 28); extrapolated driver inputs (from the units 30 and 32); driver inputs and full road geometry (from the road model 34). Note that the extrapolation units 30 and 32 simply extrapolate driver control data to provide predicted future data, utilizing well known extrapolation techniques.

In operation, the prediction model 36 is updated with a new set of initial conditions from the full chassis model 28 every frame cycle. Then, using road data and extrapolated control data, the prediction model provides positional signals indicative of chassis position and orientation, as predicted to exist five frames hence in the picture of the display D.

Signals representative of the predicted positional information from the model 36 are provided to a data input unit 38 which is in turn connected to a computer graphics system or image generator 40. The image generator drives the display D.

As explained above, the image generator 40 is a relatively slow structure and accounts for the primary time delay in the operation of the total system. For example, in one implementation of the disclosed embodiment, the image generator involves a time loss approximating a delay of forty-seven milliseconds (47 ms) at eighty-five Hertz (85 Hz) (4×11.75=47 ms, four frames of 11.75 ms). Of course, the delay accounts for a considerable volume of signal processing and computation to provide video signals that drive the dynamic picture of the display D.

To consider the overall system operation somewhat summarily, control actions by the driver at the position P result in control signals that are utilized by the suspension model 26 and the full nonlinear chassis model 28 in conjunction with signals from the road model 34 to develop status signals indicative of the current positional state of the simulated vehicle (position and orientation). The status signals are supplied to the chassis prediction model 36 along with extrapolated prediction signals from the units 30 and 32. The extrapolation signals are essentially rate-of-change indications and are developed by the extrapolation units 30 and 32. That is, from driver actions, the drive train extrapolation unit 30 provides predicted control signals to the prediction model 36 indicating a predicted drive train state for the future. Similarly, the steering and control extrapolation unit 32 provides signals regarding the steering operation.

In one form of the disclosed embodiment, the extrapolated prediction signals from the units 30 and 32 reflect conditions as predicted to exist five display frames hence in the operation of the total simulator.

The extrapolation positional data from the units 30 and 32 is utilized by the model 36 along with the current positional data from the model 28 to develop predicted positional information (signals representative of vehicle position and orientation). Thus, the developed positional information actually represents the predicted position and orientation of the vehicle at a time several display frames ahead of the instant state of the vehicle.

Assuming, as suggested, that the predicted positional signals lead the current state of the vehicle by five picture frames of the display D, e.g. sixty milliseconds (60 ms), the display can be timely with respect to the simulated vehicle. That is, if the data input unit 38 and the image generator 40 collectively involve a delay of approximately sixty milliseconds (60 ms), the signals provided to the display D will be timely. Essentially, the delays incurred by the models, e.g. models 26 and 28, reflect the inherent delay of the vehicle. Thus, utilizing display input signals which lead the instant positional data by an interval coinciding to the delay incurred by the image generator 40, allows for a timely delay by the display D. Note that the predicted display data is computed freshly for each frame and is based on extrapolated input signals sensed from the driver's control motions and the current positional information as provided from the model 28. The operation now may best be further explained with further consideration of the display D and reference to a timing diagram.

FIG. 2 is a plot of simulator events with regard to time t, moving horizontally from left to right as indicated by an arrow 48 (lower left). A waveform 50 (top) defines spaced spikes 52, each of which indicate the beginning of a display frame. In that regard, the display D (FIG. 1) may incorporate a cathode ray tube (CRT) device driven in a raster scan pattern to compose a color display or image from a multitude of individual picture elements or pixels. Individual pixel representations are computed by the image generator 40, in terms of color and intensity. Image generators in various forms are well known in the prior art and have been widely used in simulation systems. Details of various image generators are disclosed in the texts: "Principles of Interactive Computer Graphics", Second Edition, by William M. Newman and Robert F. Sproull, McGraw-Hill Book Company, 1979; and "Fundamentals of Interactive Computer Graphics", by J. D. Foley and A. Van Dam, Addison-Wesley Publishing Company, 1984.

In accordance with the conventional operation of CRT displays, each scanning or tracing of the full screen image constitutes a single frame. In an implementation hereof, frames are repeated in a cycle of approximately twelve milliseconds (12 ms) as depicted by the spaced-apart spikes 52 in FIG. 2. For convenience, the spaces between the spikes 52 are designated in sequence, "(1), (2), (3), (4)" and so on, indicating display frame intervals.

As will be apparent from FIG. 2, the time for computing the positional state for each frame can substantially coincide to the interval of a frame, e.g. intervals (1), (2), and so on. In that regard, a block 54 (left center) represents the computing interval which essentially accommodates the development of positional signals supplied from the chassis prediction model 36 (FIG. 1). Processing the positional signals by the image generator 40 and the data input unit 38 to produce image signals involves a delay of approximately thirty-six milliseconds (36 ms). That interval of three frames is represented by a block 56 (center) in FIG. 2 embracing intervals (2), (3) and (4). The image from interval (1) then is displayed during the interval (5), an operation which is represented by a block 58.

Considering the diagram of FIG. 2 further, in the operation as represented, during the interval (1) the positional state is computed for the display of a frame during the interval (5). As a result of the delay incurred in processing the state signals into image signals (represented by block 56) and embracing intervals (2), (3) and (4) the represented data for the frame of interval (5) is ready for display at the time of interval (5). Thus, the display is timely. The display is fully rendered at the start of interval (6).

As shown in FIG. 2 during the interval (2), data is finished for the display to occur during interval (7), computed as indicated by a block 60. Similarly, a block 62 indicates computation of the data predicted for the finished display during the next interval (8), not shown. Accordingly, each display is computed based on a future predicted positional state as manifest by the driver controls to thereby accomplish a timely display.

To further consider the operation of the system, assume a terrain and road program has been installed in the road model 34 (FIG. 1) embodying well known techniques and practices of the prior art. Further, assume that the suspension model 26 and the nonlinear chassis model 28 register current positional data for the simulated vehicle, again operating in accordance with well known techniques of the prior art. Accordingly, the display D shows the driver a view of current simulated conditions.

Now, assume the driver takes action and initiates a clockwise motion of the wheel 12. The movement is immediately indicated by signals from the sampling system 24. Note that in one implementation of the present invention, sampling occurs at a rate well above one hundred Hertz (100 Hz). The control signal indicating a change in the steering is processed in the steering extrapolation unit 32 to provide a predicted rate-of-change signal which is supplied to the chassis prediction model 36. The chassis prediction model 36 proceeds from data provided by the model 28 (current positional data) to compute future positional data based on the rate-of-change signals from the unit 32. Accordingly, the chassis prediction model generates signals representative of the future position and orientation of the vehicle as it will exist five frames hence. That is, the current state as simulated is used with extrapolated input to accomplish the chassis dynamics prediction as represented by signals from the model 36. In that regard, the model 36 may involve in addition to dynamic models as well known in the prior art adaptive optimal filtering techniques as are also well known in the prior art using recursive Kalman filters. Of course, in addition to steering wheel position, the model 36 also treats velocity and acceleration to generate the desired complete range of future positional signals.

Signals from the prediction model 36 are supplied through the data input unit 38 to the image generator 40 for processing into image scan signals. As discussed above, the total processing requires an interval of five frames with the consequence that the signal-represented display data emerges from the image generator 40 to drive the display D in a timely fashion. Thus, the assumed initial rotation of the wheel 12 by the driver is extrapolated to predict a display coincident with an appropriate response of the simulated vehicle.

The system as disclosed above offers the capability to follow the proper wheel torques and resulting vehicle accelerations during shifting sequences since proper engine torques are modeled accurately by the separate models. The only extrapolation involved is the assumption that the current operation by the driver continues for a predetermined number of frames after initiation of action by the driver.

In the disclosed embodiment, five frames have been used as appropriate delay for components as employed in an implementation of the present invention. If the assumption is incorrect, it is corrected at the start of the next frame after initiation. Consequently, the deviation, involving a single frame time, tends to be inconsequential. However, indications are that steering extrapolation and the resulting dynamically modeled vehicle motion will remain accurate over a full five-frame prediction time as long as the correct vehicle initial positions are updated every frame cycle as provided by the nonlinear chassis model 28 in FIG. 1.

In view of the above, it may be seen that the system of the present invention compensates for the time delay in the image generator while simultaneously providing accurate full vehicle dynamics. The technique allows real time, man-in-the-loop simulation to include vehicles whose performance envelopes previously exceeded the capabilities of conventional simulator systems.

In view of the above explanation of the exemplary system, it will be appreciated that embodiments of the present invention may be employed in many applications to simulate various vehicles. However, while certain exemplary operations have been stated herein and certain detailed structures have been disclosed, the appropriate scope hereof is deemed to be in accordance with the claims as set forth below.

What is claimed is:

1. A system for use by a driver to simulate a vehicle in real time, comprising:
   control means actuable to provide control signals representative of control actions for the simulated vehicle;
   vehicle simulation model means coupled to receive said control signals and responsive to provide representative positional signals indicative of the positional state of the simulated vehicle;
   vehicle prediction model means coupled to receive said control signals and said representative positional signals, said vehicle prediction model means for predicting from said representative positional signals and said control signals to provide predicted positional signals indicative of a future positional state of the simulated vehicle; and
   reaction display means responsive to said predicted positional signals for manifesting a positional state of said vehicle to said driver, wherein the future predicted positional signals substantially compensate for the inherent response time delay of said display means.

2. A system according to claim 1 wherein said vehicle simulation model comprises a suspension model unit and a chassis model unit.

3. A system according to claim 2 wherein said vehicle suspension model unit is a nonlinear unit.

4. A system according to claim 2 wherein said chassis model unit is a nonlinear unit.

5. A system according to claim 2 wherein said vehicle simulation model further includes a road model for simulating operating conditions for said vehicle.

6. A system according to claim 1 wherein said vehicle simulation model further includes a road model for simulating operating conditions for said vehicle.

7. A system according to claim 1 wherein said reaction means comprises a display system for manifesting a positional state of said vehicle as a visual scene.

8. A system according to claim 1 wherein said vehicle simulation model means incorporates nonlinear operating elements.

9. A system according to claim 1 wherein said reaction means comprises a graphics display apparatus.

10. A system according to claim 9 wherein said graphics display apparatus comprises a sequential frame display unit to provide a dynamic display.

11. A system according to claim 10 wherein said vehicle prediction model provides predicted positional signals at least four sequential display frames in advance of said position signals.

* * * * *